United States Patent
Fields et al.

[11] Patent Number: 5,068,614
[45] Date of Patent: Nov. 26, 1991

[54] SWEPT FREQUENCY DOMAIN RELECTOMETRY ENHANCEMENT

[75] Inventors: Walter D. Fields; Linley F. Gumm, both of Beaverton, Oreg.

[73] Assignee: Tektronix, Inc., Beaverton, Oreg.

[21] Appl. No.: 608,880

[22] Filed: Nov. 5, 1990

[51] Int. Cl.$^5$ .............................................. G01R 31/02
[52] U.S. Cl. .................................... 324/534; 324/605; 324/642; 324/644; 324/647
[58] Field of Search ............... 324/629, 637, 642, 644, 324/647, 648, 602, 605, 520, 527, 532, 533, 534; 379/26

[56] References Cited

U.S. PATENT DOCUMENTS

| | | | |
|---|---|---|---|
| 3,535,628 | 10/1970 | Altes | 324/642 |
| 3,617,880 | 11/1971 | Cormack et al. | 324/642 |
| 3,771,056 | 11/1973 | Zimmerman | 324/542 |
| 4,077,899 | 2/1978 | Shimp | 324/520 X |
| 4,734,637 | 3/1988 | Chen et al. | 324/642 |
| 4,766,386 | 8/1988 | Oliver et al. | 324/644 X |
| 4,812,738 | 3/1989 | Itaya et al. | 324/642 X |
| 4,816,767 | 3/1989 | Cannon et al. | 324/605 X |

*Primary Examiner*—Kenneth A. Wieder
*Assistant Examiner*—Robert W. Mueller
*Attorney, Agent, or Firm*—Francis I. Gray

[57] ABSTRACT

An improved swept frequency domain reflectometry instrument has an input/output terminal coupled to one end of a cable. A radio frequency at the input/output terminal is converted to an intermediate frequency using a swept local frequency. The radio frequency is derived from the swept local frequency and a variable offset frequency. A controller controls the variable offset frequency, monitoring the amplitude of the intermediate frequency. A period counter counts the intermediate frequency at a first maximum response of the intermediate frequency and further counts the offset frequency at a second maximum response of the intermediate frequency. The location of a discontinuity in the cable is calculated from the counted frequencies.

5 Claims, 3 Drawing Sheets

SWEPT FREQUENCY DOMAIN RELECTOMETRY ENHANCEMENT

BACKGROUND OF THE INVENTION

The present invention relates to a cable testing technique for locating a discontinuity point of a cable and more particularly to such a technique for enhancing the measurement accuracy of the cable testing technique on the basis of the swept frequency domain reflectometry.

A spectrum analyzer is a typical frequency domain measurement instrument which provides frequency spectrum information in the form of a graph having frequency and amplitude axes. There is a conventional measurement technique using such a frequency domain instrument to locate a fault or discontinuity point of a coaxial cable. This method requires not only a spectrum analyzer but also a tracking generator which generates a frequency matching the swept frequency of the local oscillator of the spectrum analyzer. The output frequency of the tracking generator can be controlled or offset by using a tracking adjustment knob relative to the swept frequency of the spectrum analyzer's local oscillator. The input terminal of the spectrum analyzer and the output terminal of the tracking generator are coupled to one end of a cable. At first an operator adjusts the tracking knob of the tracking generator to set it to a "zero offset" state at which the frequency difference between the local oscillator of the spectrum analyzer and the tracking generator output is equal to the center frequency of the bandwidth of the filter of the analyzer, so that a first maximum rise of the base line is displayed on the screen of the spectrum analyzer. As the operator increases the output frequency of the tracking generator by adjusting the offset frequency relative to the local oscillator frequency, the analyzer's display response begins to fall because the frequency difference between the local oscillator and the tracking generator's output is out of the bandwidth of the filter of the spectrum analyzer. The further increase of the tracking generator's output frequency causes the analyzer to produce a base line rise again and reach a second maximum response. This second maximum response is produced by the delayed signal reflected from a fault or discontinuity in the cable. The offset frequency required to maximize the second maximum response is proportional to the time delay (round trip) of the cable because the delayed signal appropriately offset in frequency relative to the local oscillator frequency is equivalent to the tracking generator's output of "zero offset" previously providing the first maximum response. Thus, plotting the display magnitude versus offset frequency provides information regarding the time delay associated with the cable's discontinuity.

The resolution of distance information, while correctly measuring the magnitude of the reflected signal, is limited by the use of a bandpass filter in the manual procedure. The measurement must be made in the length of time the spectrum analyzer takes to sweep. If a wide bandwidth is used, the spectrum analyzer responds quickly to the returning signal, reaching full amplitude before the sweep ends. However, the ability to determine exactly the frequency of the returning signal is limited because it could be anywhere in the central portion of the filter's bandpass. If a narrow bandpass filter is used in an attempt to reduce the frequency uncertainty, then the filter's risetime is too slow for the returning signal to reach full amplitude before the sweep ends. Additionally this conventional manual measurement includes some perceptual errors of an operator.

Therefore, what is desired is to provide an improved frequency domain reflectometry technique capable of automatically and precisely locating a fault or discontinuity point of a cable without being limited to the minimum resolution of the spectrum analyzer.

SUMMARY OF THE INVENTION

Accordingly the present invention provides an improved swept frequency domain reflectometry instrument for automatically and precisely locating a fault or discontinuity point of a cable without being limited to the resolution bandwidth of the spectrum analyzer. One end of the cable receives at the input/output terminal of the instrument a radio frequency derived from the frequencies of a variable offset oscillator and a swept local oscillator. A microprocessor gradually controls the offset frequency by monitoring the amplitude of an intermediate frequency derived from the radio frequency, the local oscillator frequency and a reference frequency. A period counter counts the intermediate frequency at the zero offset location which provides a first maximum response. The microprocessor further controls the offset frequency and then the counter counts the offset frequency when the amplitude of the intermediate frequency reaches a second maximum response. The microprocessor calculates the discontinuity location of the cable from the measured frequencies.

The objects, advantages and other novel features of the present invention are apparent from the following detailed description when read in conjunction with the appended claims and attached drawing.

DESCRIPTION OF PREFERRED EMBODIMENT

Figure 1:
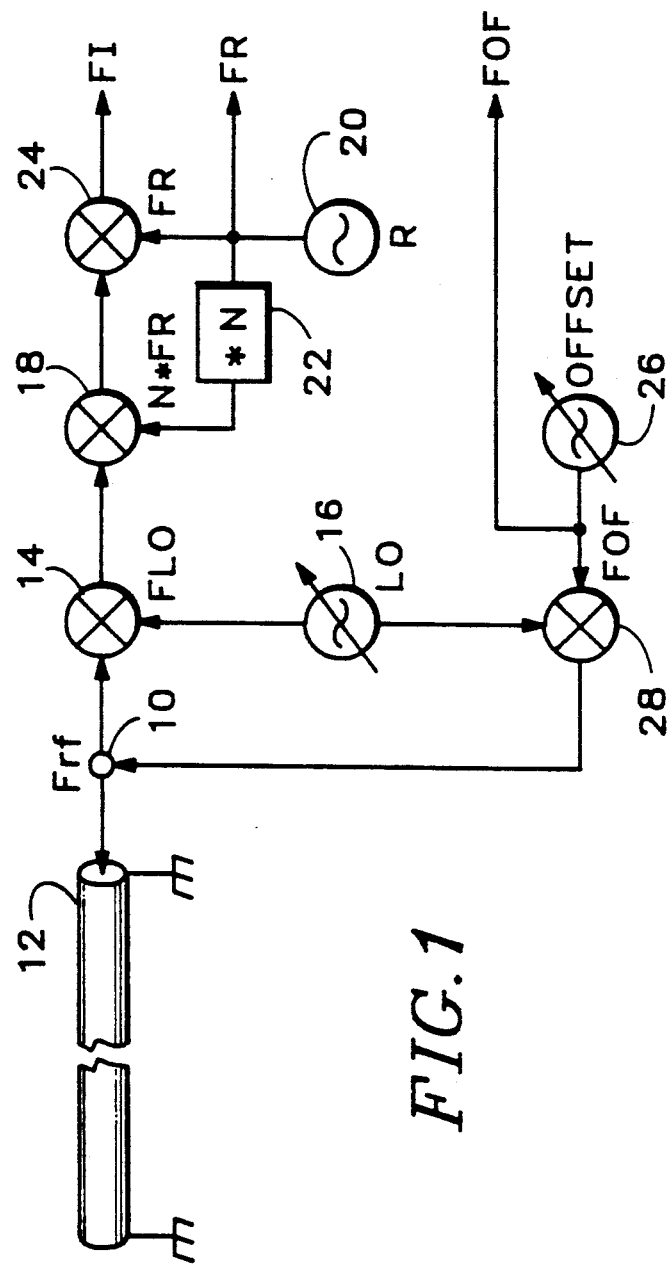
FIG. 1 is a schematic block diagram of a part of a swept frequency domain reflectometry instrument according to the present invention.

Referring now to FIG. 1, a swept frequency domain reflectometry instrument according to the present invention has an input/output terminal 10 coupled to a cable 12. A radio frequency Frf at the input/output terminal 10 is input to a first mixer 14 where it is mixed with a swept local frequency FLO from a local oscillator 16 such as a variable YIG oscillator. The output frequency from the mixer 14 is supplied to a second mixer 18 where it is mixed with an integer multiple of a known reference frequency FR from a reference oscillator 20. A multiplier 22 multiplies the reference frequency FR by a predetermined integer N and the output frequency N*FR is applied to the second mixer 18. The output frequency from the second mixer is applied to a third mixer 24 where it is mixed with the reference frequency FR from the reference oscillator 20. As described hereinafter, bandpass filters (not shown) are coupled to the respective outputs of the first, second and third mixers to appropriately select the output intermediate frequency FI from the third mixer as follows:

$$FI = FLO - Frf - (N+1)*FR \qquad (1)$$

This instrument in FIG. 1 further includes a variable offset oscillator 26. The offset frequency FOF from the offset oscillator 26 is supplied to a fourth mixer 28 where it is mixed with the swept local frequency FLO. The output frequency from the fourth mixer 28 is supplied as the radio frequency Frf to the input/output terminal 10. The radio frequency Frf is propagated through the cable 12 and reflected from a fault or discontinuity in the cable. The offset frequency FOF which causes the intermediate frequency FI to reach a second maximum response is provided in accordance with the following condition:

$$FOF = (N+1) \cdot FR + FI - SR \cdot TD \quad (2)$$

where SR is the frequency sweep rate of the local oscillator 16 and TD is the time delay required for the radio frequency to take a round trip between the discontinuity in the cable 12 and the input/output terminal 10. The time delay TD can be derived from the above formulas (1) and (2) as follows:

$$TD = [FI + (N+1) \cdot FR - FOF]/SR \quad (3)$$

The delay time TD can be directly calculated from the formula (3) by measuring the intermediate frequency FI and the offset frequency FOF assuming that the sweep rate SR of the instrument is calibrated in advance. The measurement of the intermediate frequency FI and the offset frequency FOF is performed by a period counter circuit (not shown) with reference to the precise reference frequency FR.

Figure 2:
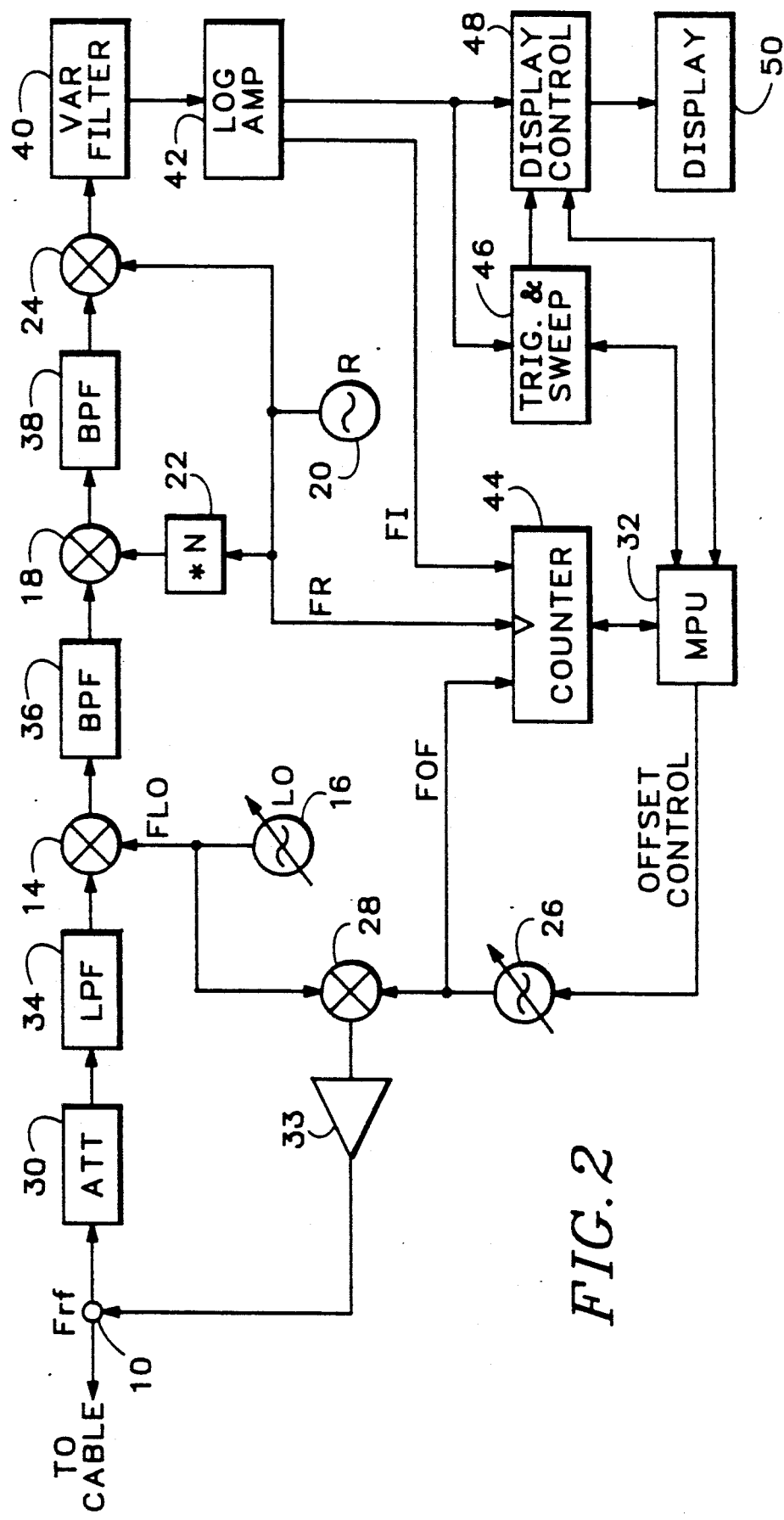
FIG. 2 is a block diagram of the instrument of FIG. 1.

A further detailed block diagram of the instrument of FIG. 1 is shown in FIG. 2. The blocks corresponding to those in FIG. 1 have the same reference numbers. The radio frequency Frf at the input/output terminal 10 is applied to an attenuator circuit 30 which appropriately attenuates the input signal according to the control of a microprocessor (MPU) 32. A buffer amplifier 33 is coupled between the input/output terminal 10 and the output of the fourth mixer 28. The attenuated signal from the attenuator 30 is applied by way of a lowpass filter 34 to the first mixer 14. The output signal of the first mixer 14 is applied to a bandpass filter 36 which attenuates the input signal components other than a first intermediate frequency (FLO−Frf). This frequency is processed by the second mixer 18 and then routed to a second bandpass filter 38 which produces a second intermediate frequency (FLO−Frf−N*FR). This frequency is applied to the third mixer 24 where it is further mixed with the frequency FR. The output signal from the third mixer 24 is processed by a variable filter circuit 40 controlled by the MPU 32. This variable filter circuit 40 has a conventional configuration including a plurality of selectable filters controlled by the MPU 32. The output of the variable filter 40 is coupled to a logarithmic amplifier 42 which performs the logarithmic conversion of an input signal. One output of the logarithmic amplifier 42 is an amplitude compressed version of the intermediate frequency FI shown in the above formula (1). A period counter 44 counts the intermediate frequency FI and the offset frequency FOF during respective periods selected by the MPU 32 to measure those frequencies by counting the reference frequency FR during the respective counting periods of the intermediate and offset frequencies. The MPU 32 calculates the frequencies of FI and FOF from the count values of the counter 44. A video signal from the logarithmic amplifier 42 is also routed to a trigger/sweep circuit 46 and a display control system 48. The trigger/sweep circuit 46 performs conventional trigger and sweep functions in accordance with the control from the MPU 32. The sweep signal corresponding to the swept frequency span of the local oscillator 16 is supplied from the trigger/sweep circuit 46 to display control system 48. The display control system 48 controls the horizontal axis, vertical axis and Z-axis of a display 50 such as a cathode-ray tube according to the control of the MPU 32. The display control system 48 may typically include an analog-to-digital converter, a display memory and a digital-to-analog converter.

Figure 3:
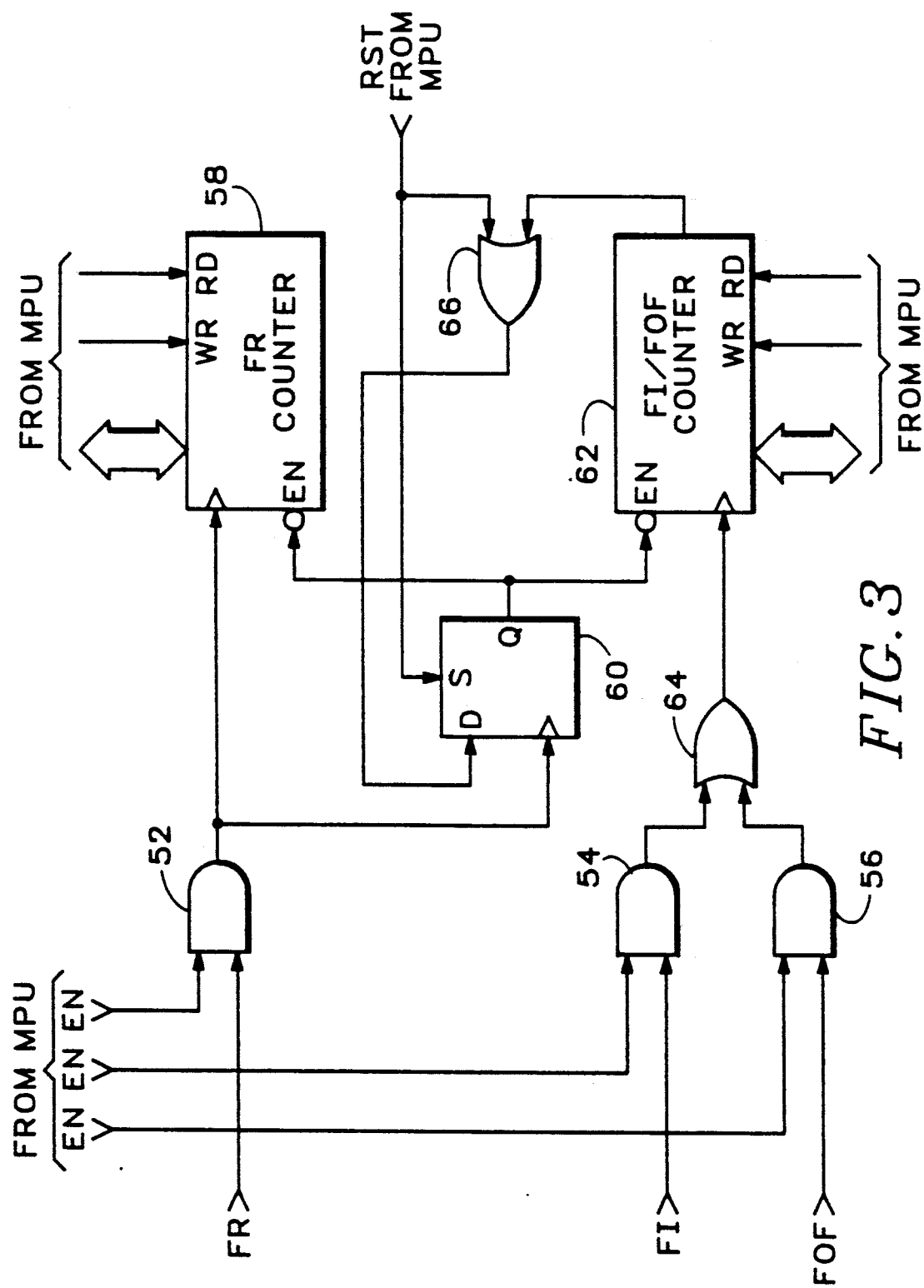
FIG. 3 is a block diagram of the counter of FIG. 2.

Referring now to FIG. 3 one embodiment of the period counter circuit 44 in FIG. 2 is shown. The reference frequency FR is applied to a first AND gate 52 which acts as a buffer amplifier when it is enabled by the MPU 32. The intermediate frequency FI is coupled to a second AND gate 54 which acts as a buffer amplifier when it is enabled by the MPU 32. The offset frequency FOF is coupled to a third AND gate 56 which acts as a buffer when it is enabled by the MPU 32. The output of the first gate 52 is coupled to the clock inputs of a FR counter 58 and a flip-flop 60. The Q output of the flip-flop 60 is coupled to the not enable inputs of the FR counter 58 and a FI/FOF counter 62. The outputs of the gates 54 and 56 are coupled by way of an OR gate 64 to the clock input of the FI/FOF counter 62. A control OR gate 66 receives the overflow signal of the FI/FOF counter 62 and a reset signal RST from the MPU 32. The RST signal is also coupled to the set terminal S of the flip-flop 60. The output of the OR gate 66 is coupled to the D input of the flip-flop 60.

In operation the MPU 32 initially sets the RST signal to a logical "1" to set the Q output of the flip-flop 60 to a logical "1" so that the counters 58 and 62 do not respond to any input frequencies. The MPU 32 disables the AND gates 52, 54 and 56 to intercept the frequencies FR, FI and FOF. The MPU 32 gradually controls the offset frequency FOF by monitoring the amplitude of the intermediate frequency FI to find a first maximum response (i.e. zero offset) of the intermediate frequency FI. The MPU 32 may detect whether the intermediate frequency FI reaches the first maximum response by monitoring the change of the amplitude of the intermediate frequency FI. When the MPU 32 finds the first maximum response of the intermediate frequency FI, it enables the AND gates 52 and 54 and turns the RST signal to a logical "0". As the D input of the flip-flop 60 goes to a logical "0", the Q output of the flip-flop 60 goes to a logical "0" in response to the leading edge of the subsequent FR pulse. The Q signal of a logical "0" enables the counters 58 and 62 and then the counters 58 and 62 start to count the reference frequency FR and the intermediate frequency respectively. The MPU 32 preloads a predetermined value in the counter 62 prior to the start of the counting operation to adjust the counting number of the intermediate frequency pulses. When the counter 62 counts the desired number of the FI pulses, the overflow signal goes to a logical "1" and then the D input of the flip-flop 60 changes to a logical "1". When the Q output of the flip-flop 60 goes to a logical "1" in response to the subsequent leading edge of the FR pulse, the counters 58 and 62 are disabled. The MPU 32 reads the count values from the counters 58 and 62 and calculates the intermediate frequency FI. The MPU 32 sets the RST signal to a logical "1", disables the AND gates 52 and 54 and sets the counters 58 and 62 to the initial values.

Then the MPU 32 further controls the offset frequency by monitoring the amplitude of the intermediate frequency FI to find a second maximum response of the FI signal. When the MPU detects the second maximum response of the intermediate frequency FI, it enables the AND gates 52 and 56 and sets the RST signal to a logical "0". Then the MPU 32 performs the same procedure as described hereinabove to determine the offset frequency FOF at the second maximum response of the intermediate frequency FI. The MPU 32 calculates the time delay TD required for the radio frequency Frf to take a round trip between the input/output terminal 10 and the discontinuity in the cable by using the above formula (3) and the determined frequencies FI and FOF. Since the propagation speed of the radio frequency Frf is known, the MPU 32 calculates the location of the discontinuity in the cable from the value of the time delay TD. The location of the discontinuity is displayed on the screen of the display device 50. The measurement of the frequencies FI and FOF can be repeated and averaged if necessary. Such an averaged measurement is effective for reducing the influence of nonlinearity or random variations of the swept local frequency FLO.

Thus, the present invention provides an improved swept frequency domain reflectometry instrument capable of automatically locating a fault or discontinuity in a cable with higher accuracy. The accuracy of the instrument of this invention is only limited by the resolution of the counters, the stability of the offset oscillator and the known accuracy of the instrument's sweep rate.

It is apparent to those skilled in the art that the present invention is not limited to the above preferred embodiment, but that many variations and modifications may be made without departing from the scope of the invention.

What is claimed is:

1. A method of locating a discontinuity in a cable under test using a spectrum analyzer, the spectrum analyzer having an input/output terminal coupled to one end of the cable, comprising the steps of:
   inserting a test signal into the cable;
   receiving a return signal from the cable resulting from the test signal;
   detecting a first maximum amplitude of an intermediate frequency obtained by mixing the return signal with a local oscillator and a reference signal;
   varying the frequency of the test signal as a function of an offset frequency;
   detecting a second maximum amplitude of the intermediate frequency resulting from the variation of the frequency of the test signal;
   measuring the intermediate frequency at the first maximum value;
   measuring the offset frequency at the second maximum value;
   determining from the measured intermediate frequency and the measured offset frequency a distance to the discontinuity; and
   displaying the distance to the discontinuity.

2. A method as recited in claim 1 wherein each measuring step comprises the steps of:
   counting the number of cycles of the reference signal that occur during a predetermined number of cycles of the intermediate and offset frequencies; and
   converting the counts from the counting step for each frequency into measured intermediate and offset frequency values from which the distance is calculated by the determining step.

3. An apparatus for locating a distance to a discontinuity in a cable under test, the apparatus having means for generating a test signal for insertion into the cable and for receiving in response to the test signal a return signal, comprising:
   means for generating an intermediate frequency from the return signal as a function of a local oscillator signal and a reference signal;
   means for offsetting the frequency of the test signal from the test signal generating means;
   means for detecting a first maximum amplitude of the intermediate frequency with no frequency offset for the test signal from the offsetting means, and for detecting a second maximum amplitude of the intermediate frequency as the frequency of the test signal is offset by the offsetting means;
   means for measuring the intermediate frequency at the first maximum amplitude and the offset frequency of the offsetting means at the second amplitude as a function of the reference signal;
   means for calculating from the measured frequencies determined by the measuring means the distance; and
   means for displaying the distance.

4. An apparatus as recited in claim 3 wherein the measuring means comprises means for counting the number of cycles of the reference signal that occur during a predetermined number of cycles of the intermediate frequency at the first maximum value and of the offset frequency at the second maximum value, the respective counts being used by the calculating means to determine the distance.

5. An apparatus as recited in claim 4 wherein the counting means comprises:
   a first counter for counting the number of cycles of the reference signal when enabled;
   a second counter for counting the predetermined number of cycles of the intermediate frequency and the offset frequency when enabled, both counters being enabled to count simultaneously; and
   means for selecting either the intermediate frequency or the offset frequency for input to the second counter, the number of reference signal cycles counted when the intermediate frequency is input to the second counter representing a value of the intermediate frequency at the first maximum amplitude value and the number of reference signal cycles counted when the offset frequency is input to the second counter representing a value of the offset frequency at the second maximum amplitude value.

* * * * *